(12) United States Patent
Hirukawa

(10) Patent No.: US 11,551,845 B2
(45) Date of Patent: Jan. 10, 2023

(54) MULTILAYER COIL COMPONENT

(71) Applicant: Murata Manufacturing Co., Ltd., Kyoto-fu (JP)

(72) Inventor: Atsuo Hirukawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 941 days.

(21) Appl. No.: 16/370,729

(22) Filed: Mar. 29, 2019

(65) Prior Publication Data

US 2019/0304655 A1 Oct. 3, 2019

(30) Foreign Application Priority Data

Apr. 2, 2018 (JP) .............................. JP2018-071001

(51) Int. Cl.
*H01F 17/00* (2006.01)
*H01F 27/28* (2006.01)
(Continued)

(52) U.S. Cl.
CPC ..... *H01F 17/0013* (2013.01); *H01F 27/2804* (2013.01); *H01F 27/292* (2013.01);
(Continued)

(58) Field of Classification Search
None
See application file for complete search history.

(56) References Cited

U.S. PATENT DOCUMENTS 6,157,285 A 12/2000 Tokuda et al.
10,614,947 B2 * 4/2020 Nakano ............... H01F 27/2804
(Continued)

FOREIGN PATENT DOCUMENTS

CN 101834060 A 9/2010
CN 107437458 A 12/2017
(Continued)

OTHER PUBLICATIONS

An Office Action mailed by China National Intellectual Property Administration dated Jul. 13, 2021 which corresponds to Chinese Patent Application No. 201910248003.X and is related to U.S. Appl. No. 16/370,729 with English language translation.
(Continued)

*Primary Examiner* — Long Pham
(74) *Attorney, Agent, or Firm* — Studebaker & Brackett PC

(57) ABSTRACT

A multilayer coil component includes a multilayer body formed by stacking a plurality of insulating layers and including a coil built therein, and first and second outer electrodes electrically connected to the coil. The coil is formed by electrically connecting a plurality of coil conductors stacked together with the insulating layers. The multilayer coil component further includes, inside the multilayer body, first and second connecting conductors. The first connecting conductor connects between a portion of the first outer electrode covering the first end face, and a coil conductor facing the portion. The second connecting conductor connects between a portion of the second outer electrode covering the second end face, and a coil conductor facing the portion. Concerning the length direction, the first and second connecting conductors each have a length from about 2.5% to about 7.5% of the length of the multilayer body.

16 Claims, 8 Drawing Sheets

(51) Int. Cl.
*H01F 27/29* (2006.01)
*H01G 4/005* (2006.01)
*H01F 41/12* (2006.01)
*H05K 1/16* (2006.01)

(52) U.S. Cl.
CPC ............. *H01F 41/12* (2013.01); *H01G 4/005* (2013.01); *H05K 1/165* (2013.01); *H01F 2017/002* (2013.01); *H01F 2027/2809* (2013.01)

(56) References Cited

U.S. PATENT DOCUMENTS

| | | |
|---|---|---|
| 2013/0314193 A1 | 11/2013 | Lee |
| 2014/0145815 A1 | 5/2014 | Ishii et al. |
| 2015/0294779 A1 | 10/2015 | Lim |
| 2016/0042862 A1 | 2/2016 | Tachibana et al. |
| 2017/0018351 A1 | 1/2017 | Yatabe et al. |
| 2017/0316867 A1 | 11/2017 | Kamijima et al. |
| 2019/0164685 A1 | 5/2019 | Hirukawa |
| 2019/0304655 A1 | 10/2019 | Hirukawa |
| 2019/0304656 A1 | 10/2019 | Hirukawa |
| 2019/0304667 A1 | 10/2019 | Hirukawa |

FOREIGN PATENT DOCUMENTS

| | | |
|---|---|---|
| JP | H08-236353 A | 9/1996 |
| JP | H10-335143 A | 12/1998 |
| JP | H11-307344 A | 11/1999 |
| JP | 2000-138120 A | 5/2000 |
| JP | 2000-331858 A | 11/2000 |
| JP | 2001-093730 A | 4/2001 |
| JP | 2001-126925 A | 5/2001 |
| JP | 2001-196240 A | 7/2001 |
| JP | 2002-093623 A | 3/2002 |
| JP | 2003-109818 A | 4/2003 |
| JP | 2005-286205 A | 10/2005 |
| JP | 2007-072612 A | 3/2007 |
| JP | 2007-324251 A | 12/2007 |
| JP | 2009-065042 A | 3/2009 |
| JP | 2012-227225 A | 11/2012 |
| JP | 2013-243366 A | 12/2013 |
| JP | 2014-107513 A | 6/2014 |
| JP | 2017-022304 A | 1/2017 |
| JP | WO2014-181755 A1 | 2/2017 |
| JP | 2017-201761 A | 11/2017 |
| JP | 2019-096819 A | 6/2019 |
| KR | 10-2015-0117888 A | 10/2015 |
| KR | 10-2019-0115418 A | 10/2019 |
| KR | 10-2019-0115419 A | 10/2019 |
| KR | 10-2210156 B1 | 2/2021 |
| KR | 10-2262350 B1 | 6/2021 |

OTHER PUBLICATIONS

An Office Action; "Notification of Reasons for Refusal," mailed by the Japanese Patent Office dated Jul. 14, 2020, which corresponds to Japanese Patent Application No. 2018-071001 and is related to U.S. Appl. No. 16/370,729 with English language translation.

An Office Action mailed by the Korean Intellectual Property Office dated Apr. 3, 2020, which corresponds to Korean Patent Application No. 10-2019-0035827 and is related to U.S. Appl. No. 16/370,729 with English language translation.

An Office Action mailed by the Korean Intellectual Property Office dated Apr. 3, 2020, which corresponds to Korean Patent Application No. 10-2019-0035964 and is related to U.S. Appl. No. 16/370,729 with English language translation.

An Office Action; "Notification of Reasons for Refusal," mailed by the Japanese Patent Office dated Jul. 14, 2020, which corresponds to Japanese Patent Application No. 2018-071002 and is related to U.S. Appl. No. 16/370,729 with English language translation.

An Office Action; "Notification of Reasons for Refusal," mailed by the Japanese Patent Office dated Jan. 21, 2020, which corresponds to Japanese Patent Application No. 2017-226910 and is related to U.S. Appl. No. 16/370,729; with English language translation.

An Office Action mailed by the Korean Intellectual Property Office dated Apr. 3, 2020, which corresponds to Korean Patent Application No. 10-2019-0035957 and is related to U.S. Appl. No. 16/370,729 with English language translation.

An Office Action; "Decision of Refusal," mailed by the Japanese Patent Office dated Mar. 16, 2021, which corresponds o Japanese Patent Application No. 2018-071003 and is related to U.S. Appl. No. 16/370,729 with English language translation.

An Office Action mailed by China National Intellectual Property Administration dated May 11, 2021 which corresponds to Chinese Patent Application No. 201811415222.4 and is related to U.S. Appl. No. 16/370,729 with English language translation.

An Office Action mailed by China National Intellectual Property Administration dated Jan. 6, 2021, which corresponds to Chinese Patent Application No. 201910248003.X and is related to U.S. Appl. No. 16/370,729 with English language translation.

An Office Action mailed by the Korean Intellectual Property Office dated Feb. 8, 2021, which corresponds to Korean Patent Application No. 10-2021-0010684 and is related to U.S. Appl. No. 16/370,729 with English language translation.

An Office Action; "Notice of Reasons for Refusal," mailed by the Japanese Patent Office dated Oct. 5, 2021, which corresponds to Japanese Patent Application No. 2020-173331 and is related to U.S. Appl. No. 16/370,729 with English translation.

* cited by examiner

MULTILAYER COIL COMPONENT

CROSS-REFERENCE TO RELATED APPLICATION

This application claims benefit of priority to Japanese Patent Application No. 2018-071001, filed Apr. 2, 2018, the entire content of which is incorporated herein by reference.

BACKGROUND

Technical Field

The present disclosure relates to a multilayer coil component.

Background Art

As an example of a multilayer coil component, a multilayer conductor is disclosed in Japanese Unexamined Patent Application Publication No. 2001-126925. The multilayer inductor includes an element body, a coil part embedded in the element body, a pair of extended parts embedded in the element body and electrically connected to the coil part, and a pair of electrodes provided at opposite end portions of the element body and electrically connected to the extended parts. The winding axis of the coil part and the electrodes intersect each other. The multilayer inductor described in Japanese Unexamined Patent Application Publication No. 2001-126925 satisfies the following condition: $1.5 < L7/L6 < 7.0$, where $L7$ is the film thickness of the coil part, and $L6$ is the thickness of each electrode.

As electrical devices are becoming faster in communication speed and smaller in size, it is becoming increasingly desirable for multilayer inductors to have satisfactory radio frequency characteristics for use in the radio frequency range (e.g., the GHz range at or above about 20 GHz).

The multilayer inductor described in Japanese Unexamined Patent Application Publication No. 2001-126925, however, is designed with the ease of mounting in mind, and does not support operation in the above-mentioned radio frequency range. Specifically, in the multilayer inductor described in Japanese Unexamined Patent Application Publication No. 2001-126925, each electrode with the thickness $L6$ is formed so as to cover the entirety of both end faces of the multilayer inductor with respect to the stacking direction. This results in a large stray capacitance due to the electrode. This stray capacitance (capacitance component) causes resonance with the inductance component of the multilayer inductor. This makes it impossible to obtain satisfactory radio frequency characteristics. Although the multilayer inductor described in Japanese Unexamined Patent Application Publication No. 2001-126925 discloses preferred ranges of values for the film thickness of the coil part, electrode thickness, and other various dimensions, none of these values take into consideration the use of the multilayer inductor in the radio frequency range at or above about 20 GHz.

SUMMARY

The present disclosure thus provides a multilayer coil component with enhanced radio frequency characteristics.

According to preferred embodiments of the present disclosure, there is provided a multilayer coil component including a multilayer body formed by stacking a plurality of insulating layers. The multilayer body includes a coil built in the multilayer body, and a first outer electrode and a second outer electrode that are electrically connected to the coil. The coil is formed by electrically connecting a plurality of coil conductors, the plurality of coil conductors being stacked together with the plurality of insulating layers. The multilayer body has a first end face and a second end face that are located opposite to each other in a length direction of the multilayer body, a first major face and a second major face that are located opposite to each other in a height direction orthogonal to the length direction, and a first lateral face and a second lateral face that are located opposite to each other in a width direction orthogonal to the length direction and to the height direction. The first outer electrode covers a part of the first end face, and extends from the first end face so as to cover a part of the first major face. The second outer electrode covers a part of the second end face, and extends from the second end face so as to cover a part of the first major face. The first major face is the mounting surface of the multilayer coil component. The stacking direction of the multilayer body, and the axial direction of the coil are parallel to the mounting surface. The multilayer coil component further includes a first connecting conductor and a second connecting conductor that are disposed inside the multilayer body. The first connecting conductor connects between a portion of the first outer electrode that covers the first end face, and one of the plurality of coil conductors that faces the portion of the first outer electrode. The second connecting conductor connects between a portion of the second outer electrode that covers the second end face, and one of the plurality of coil conductors that faces the portion of the second outer electrode. The first connecting conductor and the second connecting conductor each have a length not less than about 2.5% and not more than about 7.5% (i.e., from about 2.5% to about 7.5%) of a length of the multilayer body.

Other features, elements, characteristics and advantages of the present disclosure will become more apparent from the following detailed description of preferred embodiments of the present disclosure with reference to the attached drawings.

DETAILED DESCRIPTION

A multilayer coil component according to the present disclosure will be described below.

However, the present disclosure is not limited to embodiments described below but may be practiced with various modifications and alterations without departing from the scope of the disclosure. The disclosure also extends to combinations of desired features individually disclosed herein.

Figure 1:
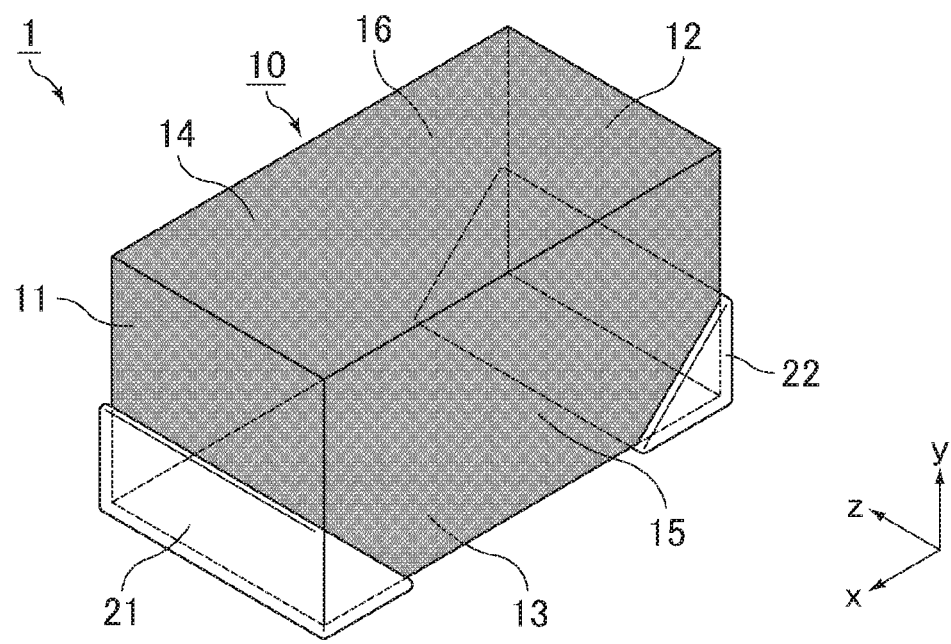
FIG. 1 is a schematic perspective view of a multilayer coil component according to an embodiment of the present disclosure.
Figure 2A:
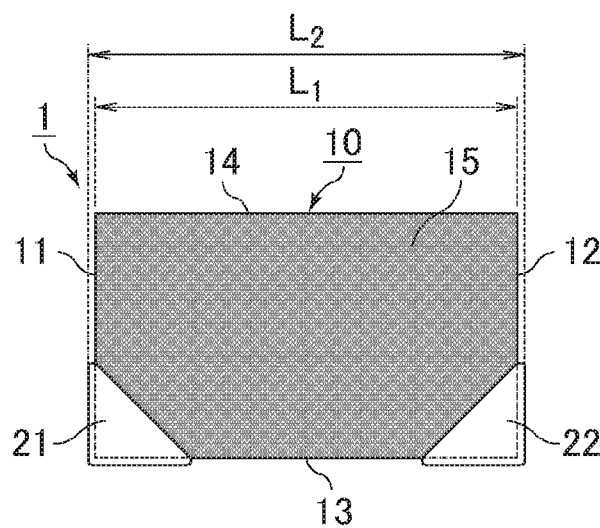
FIG. 2A is a side view of the multilayer coil component illustrated in FIG. 1.
Figure 2B:
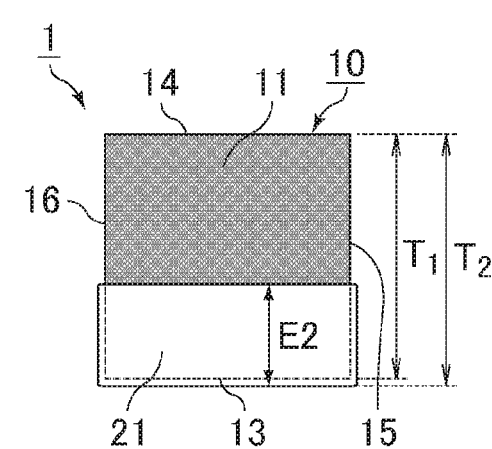
FIG. 2B is a front view of the multilayer coil component illustrated in FIG. 1.
Figure 2C:
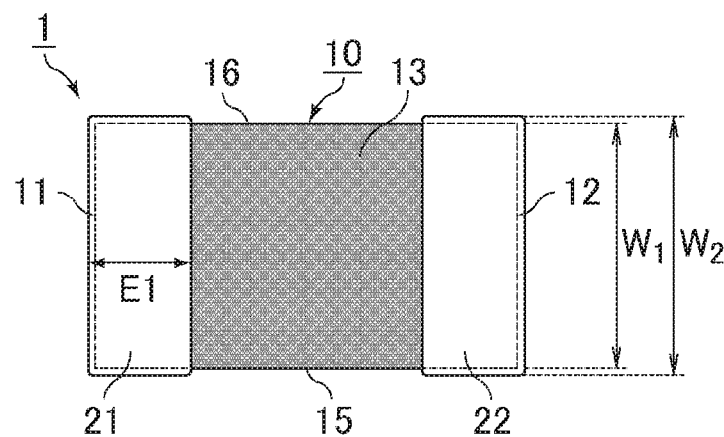
FIG. 2C is a bottom view of the multilayer coil component illustrated in FIG. 1.

FIG. 1 is a schematic perspective view of a multilayer coil component according to an embodiment of the present disclosure. FIG. 2A is a side view of the multilayer coil component illustrated in FIG. 1, FIG. 2B is a front view of the multilayer coil component illustrated in FIG. 1, and FIG. 2C is a bottom view of the multilayer coil component illustrated in FIG. 1.

A multilayer coil component 1 illustrated in FIGS. 1, 2A, 2B, and 2C includes a multilayer body 10, a first outer electrode 21, and a second outer electrode 22. The multilayer body 10 is in the form of a substantially rectangular parallelepiped with six faces. Although the configuration of the multilayer body 10 will be described later, the multilayer body 10 is formed by stacking a plurality of insulating layers, and includes a coil built therein. The first outer electrode 21 and the second outer electrode 22 are each electrically connected to the coil.

For the multilayer coil component and the multilayer body according to the present disclosure, the length, height, and width directions are respectively defined as x-direction, y-direction, and z-direction in FIG. 1. The length direction (x-direction), the height direction (y-direction), and the width direction (z-direction) are orthogonal to each other.

As illustrated in FIGS. 1, 2A, 2B, and 2C, the multilayer body 10 has a first end face 11 and a second end face 12 that are located opposite to each other in the length direction (x-direction), a first major face 13 and a second major face 14 that are located opposite to each other in the height direction (y-direction) orthogonal to the length direction, and a first lateral face 15 and a second lateral face 16 that are located opposite to each other in the width direction (z-direction) orthogonal to the length direction and to the height direction.

Although not illustrated in FIG. 1, the multilayer body 10 is preferably rounded at the corner portions and at the edge portions. A corner portion refers to a portion of the multilayer body where three faces of the multilayer body meet, and an edge portion refers to a portion of the multilayer body where two faces of the multilayer body meet.

As illustrated in FIGS. 1 and 2B, the first outer electrode 21 covers a part of the first end face 11 of the multilayer body 10, and as illustrated in FIGS. 1 and 2C, the first outer electrode 21 extends from the first end face 11 so as to cover a part of the first major face 13. As illustrated in FIG. 2B, the first outer electrode 21 covers an area of the first end face 11 including the edge portion that meets the first major face 13, but does not cover an area of the first end face 11 including the edge portion that meets the second major face 14. The first end face 11 is thus exposed in the area including the edge portion that meets the second major face 14. Further, the first outer electrode 21 does not cover the second major face 14.

In FIG. 2B, the portion of the first outer electrode 21 that covers the first end face 11 of the multilayer body 10 has a constant height E2. However, the shape of the first outer electrode 21 is not particularly limited as long as the first outer electrode 21 covers a part of the first end face 11 of the multilayer body 10. For example, in the first end face 11 of the multilayer body 10, the first outer electrode 21 may have a substantially chevron shape that increases in height from the end portion toward the central portion. In FIG. 2C, the portion of the first outer electrode 21 that covers the first major face 13 of the multilayer body 10 has a constant length E1. However, the shape of the first outer electrode 21 is not particularly limited as long as the first outer electrode 21 covers a part of the first major face 13 of the multilayer body 10. For example, in the first major face 13 of the multilayer body 10, the first outer electrode 21 may have a substantially chevron shape that increases in length from the end portion toward the central portion.

As illustrated in FIGS. 1 and 2A, the first outer electrode 21 may be disposed such that the first outer electrode 21 further extends from the first end face 11 and the first major face 13 so as to cover a part of the first lateral face 15 and a part of the second lateral face 16. In this case, as illustrated in FIG. 2A, both the portion of the first outer electrode 21 that covers the first lateral face 15, and the portion of the first outer electrode 21 that covers the second lateral face 16 are preferably formed obliquely, respectively with respect to the edge portion that meets the first end face 11 and the edge portion that meets the first major face 13. The first outer electrode 21 may not be disposed so as to cover a part of the first lateral face 15 and a part of the second lateral face 16.

The second outer electrode 22 covers a part of the second end face 12 of the multilayer body 10, and extends from the second end face 12 so as to cover a part of the first major face 13. As with the first outer electrode 21, the second outer electrode 22 covers an area of the second end face 12 including the edge portion that meets the first major face 13, but does not cover an area of the second end face 12 including the edge portion that meets the second major face 14. The second end face 12 is thus exposed in the area including the edge portion that meets the second major face 14. Further, the second outer electrode 22 does not cover the second major face 14.

As with the first outer electrode 21, the shape of the second outer electrode 22 is not particularly limited as long as the second outer electrode 22 covers a part of the second end face 12 of the multilayer body 10. For example, in the second end face 12 of the multilayer body 10, the second outer electrode 22 may have a substantially chevron shape that increases in height from the end portion toward the central portion. Further, the shape of the second outer electrode 22 is not particularly limited as long as the second outer electrode 22 covers a part of the first major face 13 of the multilayer body 10. For example, in the first major face 13 of the multilayer body 10, the second outer electrode 22 may have a substantially chevron shape that increases in length from the end portion toward the central portion.

As with the first outer electrode 21, the second outer electrode 22 may be disposed such that the second outer electrode 22 further extends from the second end face 12 and the first major face 13 so as to cover a part of the first lateral face 15 and a part of the second lateral face 16. In this case, both the portion of the second outer electrode 22 that covers the first lateral face 15, and the portion of the second outer electrode 22 that covers the second lateral face 16 are preferably formed obliquely, respectively with respect to the edge portion that meets the second end face 12 and the edge portion that meets the first major face 13. The second outer electrode 22 may not be disposed so as to cover a part of the first lateral face 15 and a part of the second lateral face 16.

The first outer electrode 21 and the second outer electrode 22 are disposed as described above. Accordingly, in mounting the multilayer coil component 1 on a substrate, the first major face 13 of the multilayer body 10 serves as the mounting surface.

Although the multilayer coil component according to the present disclosure is not limited to a particular size, the multilayer coil component is preferably 0603, 0402, or 1005 in size.

If the multilayer coil component according to the present disclosure is 0603 in size, the length of the multilayer body (length indicated by a double-arrowed line $L_1$ in FIG. 2A) is preferably not more than about 0.63 mm, and preferably not less than about 0.57 mm (i.e., from about 0.57 mm to about 0.63 mm). If the multilayer coil component according to the present disclosure is 0603 in size, the width of the multilayer body (length indicated by a double-arrowed line $W_1$ in FIG. 2C) is preferably not more than about 0.33 mm, and preferably not less than about 0.27 mm (i.e., from about 0.27 mm to about 0.33 mm). If the multilayer coil component according to the present disclosure is 0603 in size, the height of the multilayer body (length indicated by a double-arrowed line $T_1$ in FIG. 2B) is preferably not more than about 0.33 mm, and preferably not less than about 0.27 mm (i.e., from about 0.27 mm to about 0.33 mm).

If the multilayer coil component according to the present disclosure is 0603 in size, the length of the multilayer coil component (length indicated by a double-arrowed line L2 in FIG. 2A) is preferably not more than about 0.63 mm, and preferably not less than about 0.57 mm (i.e., from about 0.57 mm to about 0.63 mm). If the multilayer coil component according to the present disclosure is 0603 in size, the width of the multilayer coil component (length indicated by a double-arrowed line $W_2$ in FIG. 2C) is preferably not more than about 0.33 mm, and preferably not less than about 0.27 mm (i.e., from about 0.27 mm to about 0.33 mm).

If the multilayer coil component according to the present disclosure is 0603 in size, the height of the multilayer coil component (length indicated by a double-arrowed line $T_2$ in FIG. 2B) is preferably not more than about 0.33 mm, and preferably not less than about 0.27 mm (i.e., from about 0.27 mm to about 0.33 mm). If the multilayer coil component according to the present disclosure is 0603 in size, the portion of the first outer electrode that covers the first major face of the multilayer body preferably has a length (length indicated by a double-arrowed line $E_1$ in FIG. 2C) of not less than about 0.12 mm and not more than about 0.22 mm (i.e., from about 0.12 mm to about 0.22 mm). Likewise, the portion of the second outer electrode that covers the first major face of the multilayer body preferably has a length of not less than about 0.12 mm and not more than about 0.22 mm (i.e., from about 0.12 mm to about 0.22 mm).

If the portion of the first outer electrode that covers the first major face of the multilayer body, and the portion of the second outer electrode that covers the first major face of the multilayer body do not have a constant length, the length at their longest part is preferably within the above-mentioned range.

If the multilayer coil component according to the present disclosure is 0603 in size, the portion of the first outer electrode that covers the first end face of the multilayer body preferably has a height (length indicated by a double-arrowed line E2 in FIG. 2B) of not less than about 0.10 mm and not more than about 0.20 mm (i.e., from about 0.10 mm to about 0.20 mm). Likewise, the portion of the second outer electrode that covers the second end face of the multilayer body preferably has a height of not less than about 0.10 mm and not more than about 0.20 mm (i.e., from about 0.10 mm to about 0.20 mm). In this case, the stray capacitance due to each outer electrode can be reduced. If the portion of the first outer electrode that covers the first end face of the multilayer body, and the portion of the second outer electrode that covers the second end face of the multilayer body do not have a constant height, the height at their highest part is preferably within the above-mentioned range.

If the multilayer coil component according to the present disclosure is 0402 in size, the length of the multilayer body is preferably not less than about 0.38 mm and not more than about 0.42 mm (i.e., from about 0.38 mm to about 0.42 mm), and the width of the multilayer body is preferably not less than about 0.18 mm and not more than about 0.22 mm (i.e., from about 0.18 mm to about 0.22 mm). If the multilayer coil component according to the present disclosure is 0402 in size, the height of the multilayer body is preferably not less than about 0.18 mm and not more than about 0.22 mm (i.e., from about 0.18 mm to about 0.22 mm).

If the multilayer coil component according to the present disclosure is 0402 in size, the length of the multilayer coil component is preferably not more than about 0.42 mm, and preferably not less than about 0.38 mm (i.e., from about 0.38 mm to about 0.42 mm). If the multilayer coil component according to the present disclosure is 0402 in size, the width of the multilayer coil component is preferably not more than about 0.22 mm, and preferably not less than about 0.18 mm (i.e., from about 0.18 mm to about 0.22 mm). If the multilayer coil component according to the present disclosure is 0402 in size, the height of the multilayer coil component is preferably not more than about 0.22 mm, and preferably not less than about 0.18 mm (i.e., from about 0.18 mm to about 0.22 mm).

If the multilayer coil component according to the present disclosure is 0402 in size, the portion of the first outer electrode that covers the first major face of the multilayer body preferably has a length of not less than about 0.08 mm and not more than about 0.15 mm (i.e., from about 0.08 mm to about 0.15 mm). Likewise, the portion of the second outer electrode that covers the first major face of the multilayer body preferably has a length of not less than about 0.08 mm and not more than about 0.15 mm (i.e., from about 0.08 mm to about 0.15 mm).

If the multilayer coil component according to the present disclosure is 0402 in size, the portion of the first outer electrode that covers the first end face of the multilayer body preferably has a height of not less than about 0.06 mm and not more than about 0.13 mm (i.e., from about 0.06 mm to about 0.13 mm). Likewise, the portion of the second outer electrode that covers the second end face of the multilayer body preferably has a height of not less than about 0.06 mm and not more than about 0.13 mm (i.e., from about 0.06 mm to about 0.13 mm). In this case, the stray capacitance due to each outer electrode can be reduced.

If the multilayer coil component according to the present disclosure is 1005 in size, the length of the multilayer body is preferably not less than about 0.95 mm and not more than about 1.05 mm (i.e., from about 0.95 mm to about 1.05 mm), and the width of the multilayer body is preferably not less than about 0.45 mm and not more than about 0.55 mm (i.e., from about 0.45 mm to about 0.55 mm). If the multilayer coil component according to the present disclosure is 1005 in size, the height of the multilayer body is preferably not less than about 0.45 mm and not more than about 0.55 mm (i.e., from about 0.45 mm to about 0.55 mm).

If the multilayer coil component according to the present disclosure is 1005 in size, the length of the multilayer coil component is preferably not more than about 1.05 mm, and preferably not less than about 0.95 mm (i.e., from about 0.95 mm to about 1.05 mm). If the multilayer coil component according to the present disclosure is 1005 in size, the width of the multilayer coil component is preferably not more than about 0.55 mm, and preferably not less than about 0.45 mm (i.e., from about 0.45 mm to about 0.55 mm). If the multilayer coil component according to the present disclosure is 1005 in size, the height of the multilayer coil component is preferably not more than about 0.55 mm, and preferably not less than about 0.45 mm (i.e., from about 0.45 mm to about 0.55 mm).

If the multilayer coil component according to the present disclosure is 1005 in size, the portion of the first outer electrode that covers the first major face of the multilayer body preferably has a length of not less than about 0.20 mm and not more than about 0.38 mm (i.e., from about 0.20 mm to about 0.38 mm). Likewise, the portion of the second outer electrode that covers the first major face of the multilayer body preferably has a length of not less than about 0.20 mm and not more than about 0.38 mm (i.e., from about 0.20 mm to about 0.38 mm).

If the multilayer coil component according to the present disclosure is 1005 in size, the portion of the first outer electrode that covers the first end face of the multilayer body preferably has a height of not less than about 0.15 mm and not more than about 0.33 mm (i.e., from about 0.15 mm to about 0.33 mm). Likewise, the portion of the second outer electrode that covers the second end face of the multilayer body preferably has a height of not less than about 0.15 mm and not more than about 0.33 mm (i.e., from about 0.15 mm to about 0.33 mm). In this case, the stray capacitance due to each outer electrode can be reduced.

Figure 3:
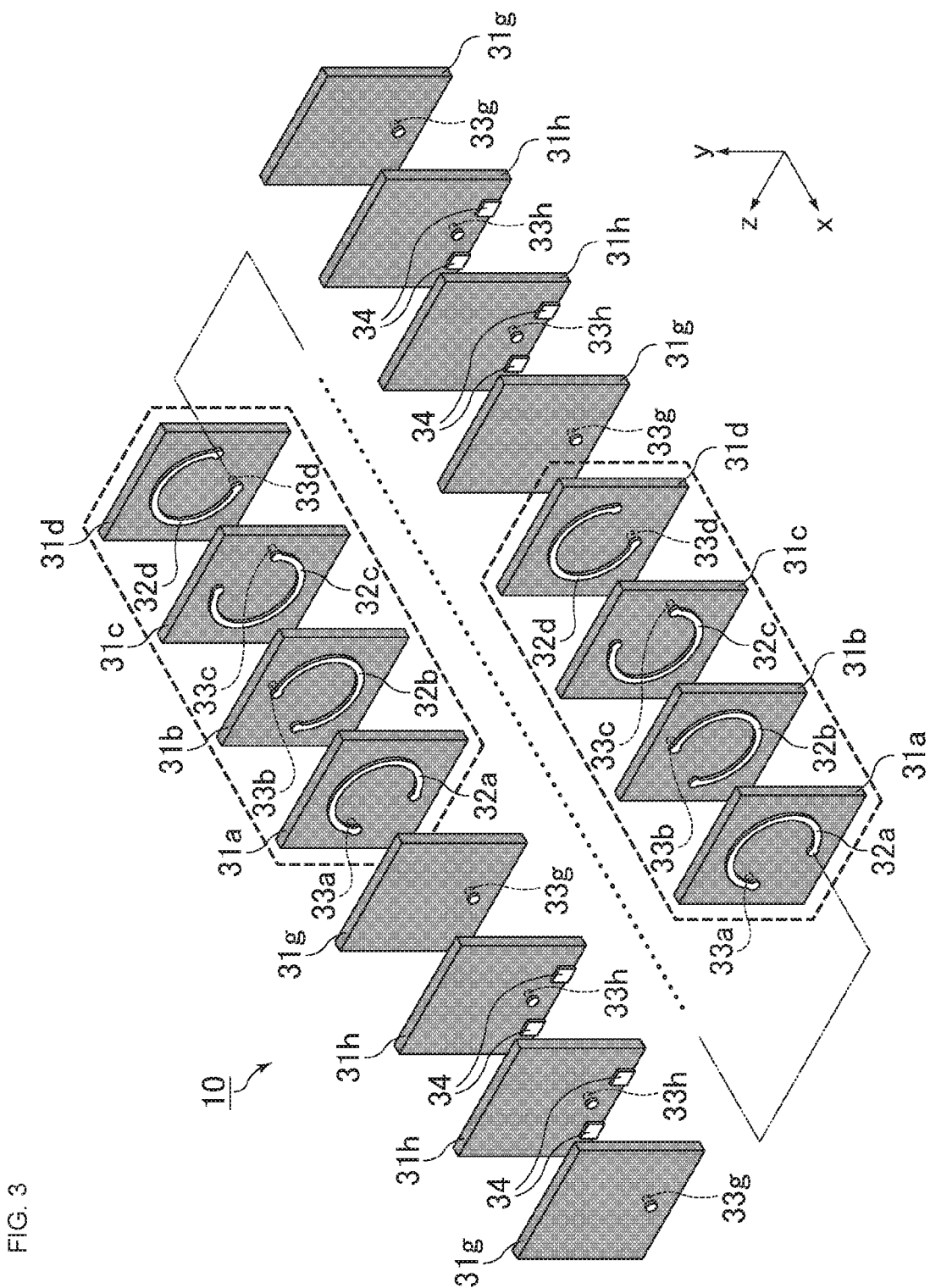
FIG. 3 is an exploded perspective view schematically illustrating an example of a multilayer body constituting the multilayer coil component illustrated in FIG. 1.
Figure 4:
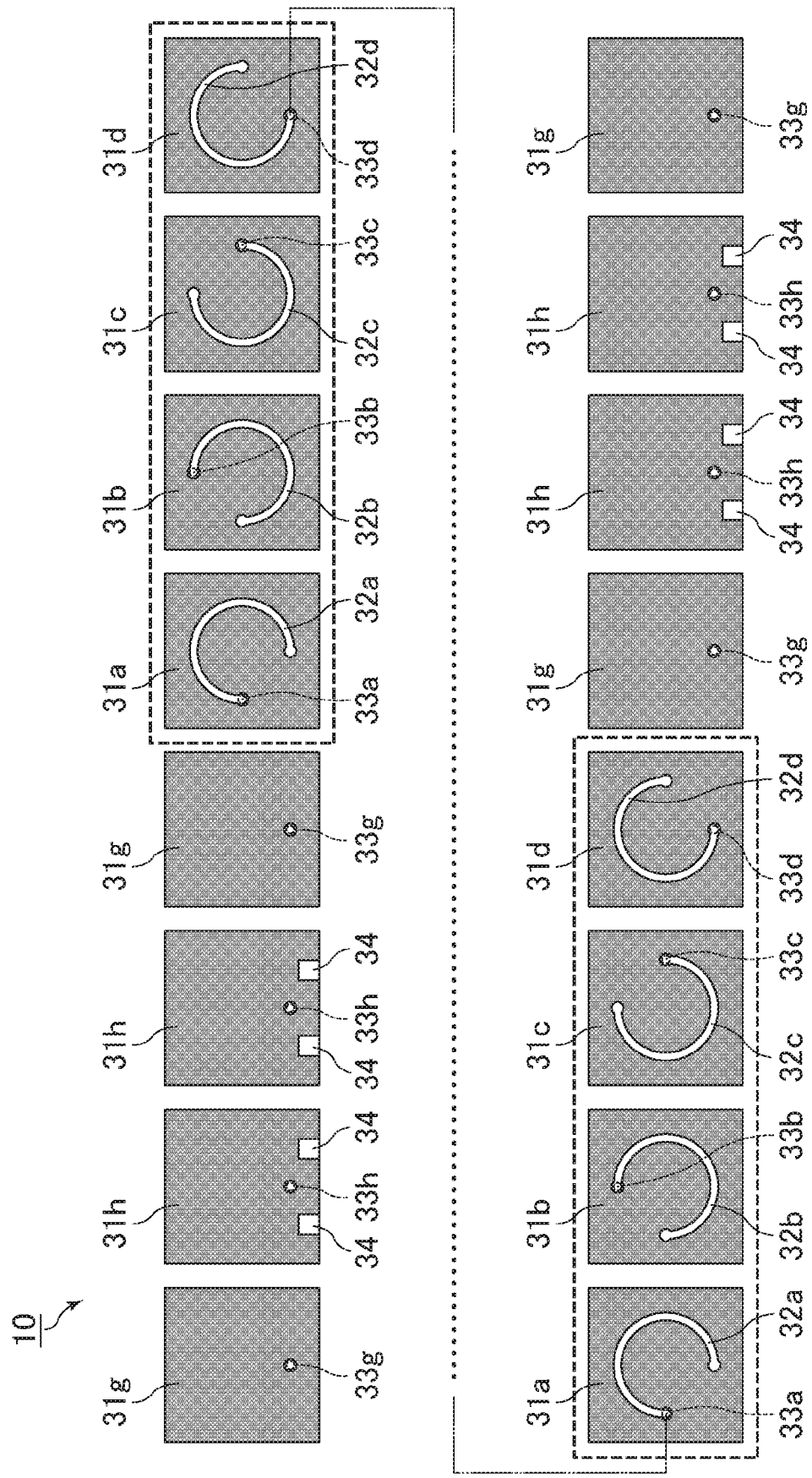
FIG. 4 is an exploded plan view schematically illustrating an example of a multilayer body constituting the multilayer coil component illustrated in FIG. 1.

FIG. 3 is an exploded perspective view schematically illustrating an example of a multilayer body constituting the multilayer coil component illustrated in FIG. 1. FIG. 4 is an exploded plan view schematically illustrating an example of a multilayer body constituting the multilayer coil component illustrated in FIG. 1.

As illustrated in FIGS. 3 and 4, the multilayer body 10 is made up of a plurality of insulating layers 31a, 31b, 31c, 31d, 31g, and 31h stacked in the length direction (x-direction). It is to be noted, however, that the insulating layer 31h may not necessarily be provided.

The direction in which the insulating layers constituting the multilayer body are stacked together is herein referred to as stacking direction.

The insulating layers 31a, 31b, 31c and 31d are respectively provided with coil conductors 32a, 32b, 32c, and 32d, and via conductors 33a, 33b, 33c, and 33d. The insulating layer 31g is provided with a via conductor 33g. The insulating layer 31h is provided with a via conductor 33h and a marking conductor pattern 34.

The coil conductors 32a, 32b, 32c, and 32d are respectively provided on the major faces of the insulating layers 31a, 31b, 31c and 31d, and stacked together with the insulating layers 31a, 31b, 31c, 31d, 31g, and 31h. In FIGS. 3 and 4, the coil conductors have a substantially ¾ turn shape, and are stacked in repeated units with the insulating layers 31a, 31b, 31c and 31d constituting each one unit (equivalent to three turns).

The via conductors 33a, 33b, 33c, 33d, 33g, and 33h are provided so as to respectively penetrate the insulating layers 31a, 31b, 31c, 31d, 31g, and 31h in the thickness direction (x-direction in FIG. 3). Normally, a land connected to the corresponding via conductor is provided on the major face of each insulating layer. The land preferably has a size slightly larger than the line width of each coil conductor.

The marking conductor pattern 34 is provided on the major face of the insulating layer 31h. In FIGS. 3 and 4, the marking conductor pattern 34 is provided at two locations on the major face of the insulating layer 31h. At each of the two locations, the marking conductor pattern 34 is in contact with the outer peripheral edge of the insulating layer 31h.

The insulating layers 31a, 31b, 31c, 31d, 31g, and 31h configured as described above are stacked in the x-direction as illustrated in FIG. 3. The coil conductors 32a, 32b, 32c, and 32d are thus electrically connected by the via conductors 33a, 33b, 33c, and 33d. As a result, a substantially solenoid-shaped coil with a coil axis extending in the x-direction is formed inside the multilayer body 10.

Further, the via conductors 33g and 33h serve as a connecting conductor within the multilayer body 10, and are exposed on both end faces of the multilayer body 10. As will be described later, within the multilayer body 10, such a connecting conductor connects between the first outer electrode 21 and the coil conductor 32a facing the first outer electrode 21, or connects between the second outer electrode 22 and the coil conductor 32d facing the second outer electrode 22. The marking conductor pattern 34 is exposed on the first major face 13 of the multilayer body 10 to serve as a discrimination mark.

Figure 5A:
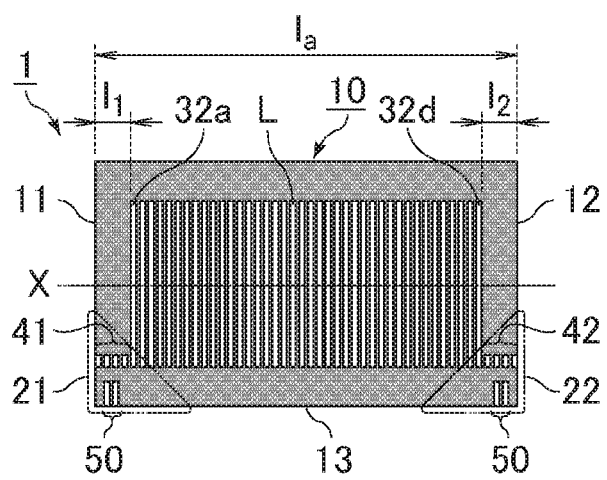
FIG. 5A is a side view schematically illustrating an example of the internal structure of a multilayer body constituting a multilayer coil component according to an embodiment of the present disclosure.
Figure 5B:
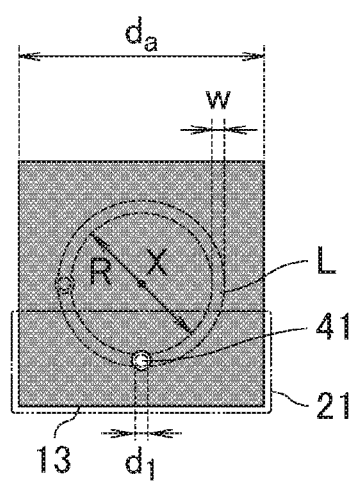
FIG. 5B is a front view schematically illustrating an example of a first end face of a multilayer body constituting a multilayer coil component according to an embodiment of the present disclosure.
Figure 5C:
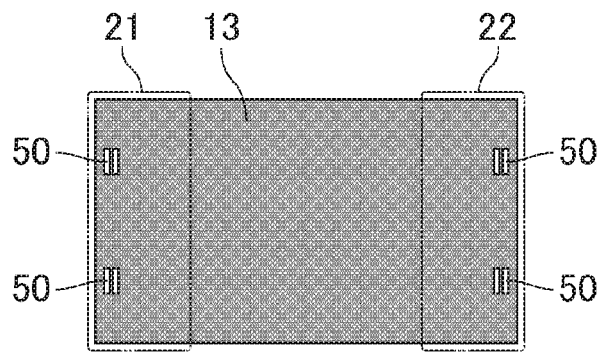
FIG. 5C is a bottom view schematically illustrating an example of a first major face of a multilayer body constituting a multilayer coil component according to an embodiment of the present disclosure.

FIG. 5A is a side view schematically illustrating an example of the internal structure of a multilayer body constituting a multilayer coil component according to an embodiment of the present disclosure. FIG. 5B is a front view schematically illustrating an example of the first end face of a multilayer body constituting a multilayer coil component according to an embodiment of the present disclosure. FIG. 5C is a bottom view schematically illustrating an example of the first major face of a multilayer body constituting a multilayer coil component according to an embodiment of the present disclosure. FIG. 5A is intended to schematically illustrate the positional relationship among the coil, the connecting conductors, and the discrimination mark as well as the stacking direction of the multilayer body, and does not precisely represent the actual shapes, connections, and other such features of these components. For example, in actuality, the coil conductors constituting the coil are connected by the via conductors, and the via conductors constituting each connecting conductor are connected to each other.

As illustrated in FIG. 5A, in the multilayer coil component 1, the stacking direction of the multilayer body 10, and the axial direction of a coil L (indicated as the center axis X of the coil L in FIG. 5A) are parallel to the first major face 13, which serves as the mounting surface of the multilayer body 10. Within the multilayer body 10, a first connecting conductor 41 connects between the portion of the first outer electrode 21 that covers the first end face 11, and the coil conductor 32a facing the portion of the first outer electrode 21. Likewise, within the multilayer body 10, a second connecting conductor 42 connects between the portion of the second outer electrode 22 that covers the second end face 12, and the coil conductor 32d facing the portion of the second outer electrode 22.

Both the length of the first connecting conductor 41, $l_1$, and the length of the second connecting conductor 42, $l_2$, are not less than about 2.5% and not more than about 7.5% (i.e., from about 2.5% to about 7.5%) of the length of the multilayer body 10, $l_a$. If the length $l_1$ of the first connecting conductor 41 and the length 12 of the second connecting conductor 42 are not less than about 2.5% and not more than about 7.5% (i.e., from about 2.5% to about 7.5%) of the length of the multilayer body 10, the inductance component of each of the first connecting conductor 41 and the second connecting conductor 42 is reduced, leading to enhanced radio frequency characteristics.

The length of the first connecting conductor 41 refers to the distance between the portion of the first outer electrode 21 that covers the first end face 11, and the coil conductor 32a facing the portion of the first outer electrode 21, and does not mean the actual winding length of the first connecting conductor 41. Likewise, the length of the second connecting conductor 42 refers to the distance between the portion of the second outer electrode 22 that covers the second end face 12, and the coil conductor 32d facing the portion of the second outer electrode 22, and does not mean the actual winding length of the second connecting conductor 42.

Although the first connecting conductor and the second connecting conductor are not limited to a particular shape, preferably, the first connecting conductor and the second connecting conductor each linearly connect the corresponding coil conductor with the outer electrode.

Providing a linear connection from the coil conductor to the outer electrode as described above makes it possible to simplify the configuration of the extended part, and also enhance radio frequency characteristics.

If the multilayer coil component according to the present disclosure is 0603 in size, the length of each of the first connecting conductor and the second connecting conductor is preferably not less than about 15 μm and not more than about 45 μm (i.e., from about 15 μm to about 45 μm), more preferably not less than about 15 μm and not more than about 30 μm (i.e., from about 15 μm to about 30 μm).

If the multilayer coil component according to the present disclosure is 0402 in size, the length of each of the first connecting conductor and the second connecting conductor is preferably not less than about 10 μm and not more than about 30 μm (i.e., from about 10 μm to about 30 μm), more preferably not less than about 10 μm and not more than about 25 μm (i.e., from about 10 μm to about 25 μm).

If the multilayer coil component according to the present disclosure is 1005 in size, the length of each of the first connecting conductor and the second connecting conductor is preferably not less than about 25 μm and not more than about 75 μm (i.e., from about 25 μm to about 75 μm), more preferably not less than about 25 μm and not more than about 50 μm (i.e., from about 25 μm to about 50 μm).

It is to be noted that as long as the via conductors constituting each connecting conductor overlap each other as viewed in plan view in the stacking direction, the via conductors constituting the connecting conductor may not necessarily be precisely aligned in a linear fashion.

As illustrated in FIG. 5B, as viewed in plan view in the stacking direction, the first connecting conductor 41 overlaps the coil conductors constituting the coil L, and as illustrated in FIG. 5A, the first connecting conductor 41 is positioned closer to the first major face 13, which is the mounting surface, than is the center axis X of the coil L. Likewise, as viewed in plan view in the stacking direction, the second connecting conductor 42 overlaps the coil conductors constituting the coil L, and is positioned closer to the first major face 13, which is the mounting surface, than is the center axis X of the coil L.

In FIGS. 5A and 5B, each of the first connecting conductor 41 and the second connecting conductor 42 is located at the position closest to the first major face 13, within the area overlapping the coil conductors constituting the coil L as viewed in plan view in the stacking direction. However, the first connecting conductor 41 may be located at any position, as long as the first connecting conductor 41 overlaps the coil conductors constituting the coil L as viewed in plan view in the stacking direction and is connected to the first outer electrode 21. Likewise, the second connecting conductor 42 may be located at any position, as long as the second connecting conductor 42 overlaps the coil conductors constituting the coil L as viewed in plan view in the stacking direction and is connected to the second outer electrode 22. Although in FIG. 5A the first connecting conductor 41 and the second connecting conductor 42 overlap each other as viewed in plan view in the stacking direction, the first connecting conductor 41 and the second connecting conductor 42 may not overlap each other.

As illustrated in FIG. 5B, as viewed in plan view in the stacking direction, the coil conductors constituting the coil L preferably overlap each other. Further, as viewed in plan view in the stacking direction, the coil L is preferably substantially circular in shape. If the coil L has a land, the shape of the coil L refers to the shape excluding the land.

Although the line width of the coil conductor (length indicated by "w" in FIG. 5B) as viewed in plan view in the stacking direction is not particularly limited, the line width is preferably not less than about 10% and not more than about 30% (i.e., from about 10% to about 30%) of the width of the multilayer body. If the line width of the coil conductor is less than about 10% of the width of the multilayer body, this may result in increased direct-current resistance Rdc in some cases. By contrast, if the line width of the coil conductor exceeds about 30% of the width of the multilayer body, this may result in increased electrostatic capacity of the coil and consequently deteriorated radio frequency characteristics in some cases.

If the multilayer coil component according to the present disclosure is 0603 in size, the line width of the coil conductor is preferably not less than about 30 μm and not more than about 90 μm (i.e., from about 30 μm to about 90 μm), more preferably not less than about 30 μm and not more than about 70 μm (i.e., from about 30 μm to about 70 μm).

If the multilayer coil component according to the present disclosure is 0402 in size, the line width of the coil conductor is preferably not less than about 20 μm and not more than about 60 μm (i.e., from about 20 μm to about 60 μm), more preferably not less than about 20 μm and not more than about 50 μm (i.e., from about 20 μm to about 50 μm).

If the multilayer coil component according to the present disclosure is 1005 in size, the line width of the coil conductor is preferably not less than about 50 μm and not more than about 150 μm (i.e., from about 50 μm to about 150 μm), more preferably not less than about 50 µm and not more than about 120 µm (i.e., from about 50 µm to about 120 µm).

Although the inner diameter of the coil conductor (length indicated by "R" in FIG. 5B) as viewed in plan view in the stacking direction is not particularly limited, the inner diameter is preferably not less than about 15% and not more than about 40% (i.e., from about 15% to about 40%) of the width of the multilayer body.

If the multilayer coil component according to the present disclosure is 0603 in size, the inner diameter of the coil conductor is preferably not less than about 50 µm and not more than about 100 µm (i.e., from about 50 µm to about 100 µm).

If the multilayer coil component according to the present disclosure is 0402 in size, the inner diameter of the coil conductor is preferably not less than about 30 µm and not more than about 70 µm (i.e., from about 30 µm to about 70 µm).

If the multilayer coil component according to the present disclosure is 1005 in size, the inner diameter of the coil conductor is preferably not less than about 80 µm and not more than about 170 µm (i.e., from about 80 µm to about 170 µm).

The width of the first connecting conductor 41 (length indicated by a double-arrowed line $d_1$ in FIG. 5B) and the width of the second connecting conductor 42 (not illustrated) are preferably not less than about 8% and not more than about 20% (i.e., from about 8% to about 20%) of the width of the multilayer body 10 (length indicated by a double-arrowed line $d_a$ in FIG. 5B).

The width of a connecting conductor refers to the width at the narrowest part of the connecting conductor. That is, even if a connecting conductor includes a land, the shape of the connecting conductor refers to its shape excluding the land.

If the multilayer coil component according to the present disclosure is 0603 in size, the width of the connecting conductor is preferably not less than about 30 µm and not more than about 60 µm (i.e., from about 30 µm to about 60 µm).

If the multilayer coil component according to the present disclosure is 0402 in size, the width of the connecting conductor is preferably not less than about 20 µm and not more than about 40 µm (i.e., from about 20 µm to about 40 µm).

If the multilayer coil component according to the present disclosure is 1005 in size, the width of the connecting conductor is preferably not less than about 40 µm and not more than about 100 µm (i.e., from about 40 µm to about 100 µm).

A discrimination mark 50 is provided at a location on the surface of the multilayer body 10 where the first outer electrode 21 or the second outer electrode 22 is disposed. In FIGS. 5A and 5C, the discrimination mark 50 is provided on the first major face 13 of the multilayer body 10. Providing the discrimination mark on the surface of the multilayer body as described above allows easy discrimination of the location where each outer electrode is to be formed. This enables automatic discrimination using a sensor or other devices.

Although the discrimination mark is preferably provided on the first major face of the multilayer body, as long as the discrimination mark is provided at a location where the first outer electrode or the second outer electrode is disposed, the discrimination mark may be provided on the first end face or the second end face, or may be provided on the first lateral face or the second lateral face.

In the example illustrated in FIG. 5C, the discrimination mark 50 is provided in each of four areas including the respective corner portions of the first major face 13, with each single discrimination mark 50 being made up of two lines. It is to be noted that each single discrimination mark may be made up of a single line, or may be made up of three or more lines. If the discrimination mark is provided in each of a plurality of areas, the number of lines included in each single discrimination mark may be the same or different.

Although the length of each line constituting the discrimination mark (its dimension in the width direction of the multilayer body) is not particularly limited, the length of the line is preferably not less than about 0.04 mm and not more than about 0.1 mm (i.e., from about 0.04 mm to about 0.1 mm). The width of the line (its dimension in the length direction of the multilayer body), the shape of the line, or other such features of the line are not particularly limited, either.

The discrimination mark may be either provided on the insulating layer so as to be exposed on the surface of the multilayer body, or provided on the surface of the multilayer body obtained after individual insulating layers are stacked together. Preferably, the discrimination mark is provided on the insulating layer. In other words, the discrimination mark is preferably provided such that the discrimination mark extends from within the interior of the multilayer body so as to be exposed on the surface of the multilayer body.

In particular, the discrimination mark is preferably formed by a conductor pattern provided on the insulating layer. In this case, by disposing the conductor pattern in contact with the outer peripheral edge of the insulating layer, the contacting portion of the conductor pattern can be exposed from the multilayer body. This allows for each easy formation of the discrimination mark. It is to be noted, however, that the discrimination mark is not limited to a particular material but may be made of a material other than a conductor, for example, a ceramic material.

The multilayer coil component according to the present disclosure may not be provided with the discrimination mark.

The multilayer body of the multilayer coil component according to the present disclosure may not necessarily have the structure illustrated in FIGS. 3 and 4. For example, the shape of the coil conductor provided in each of the insulating layers 31a, 31b, 31c and 31d, or the shape of the marking conductor pattern provided in the insulating layer 31h can be changed as desired. Further, the number and order of the insulating layers 31g and 31h stacked outside the coil can be changed as desired. Further, the location, shape, and number of each of the first and second connecting conductors that connect the coil to the corresponding outer electrodes can be changed as desired. It is to be noted that the insulating layer 31h may not necessarily be provided.

In the multilayer coil component according to the present disclosure, the coil may be made up of two or more coil conductors connected in parallel.

Connecting two or more coil conductors in parallel as described above makes it possible to reduce direct-current resistance (Rdc) without changing the line width of each coil conductor.

For example, by stacking the insulating layers in FIGS. 3 and 4 in the following order: 31a, 31a, 31b, 31b, 31c, 31c, 31d, and 31d, it is possible to obtain a structure with parallel connections of two coil conductors. It is to be noted, however, that of the two insulating layers corresponding to the same coil conductor pattern, one insulating layer disposed above (closer to the first end face 11 than) the other in the stacking direction needs to have a via conductor provided at each end of the coil conductor.

If the multilayer coil component according to the present disclosure is 0603 in size, the distance between the coil conductors in the stacking direction is preferably not less than about 3 μm and not more than about 7 μm (i.e., from about 3 μm to about 7 μm). By setting the distance between the coil conductors in the stacking direction to be not less than about 3 μm and not more than about 7 μm (i.e., from about 3 μm to about 7 μm), the number of turns of the coil can be increased, thus making it possible to increase impedance. This also makes it possible to increase the transmission coefficient S21 in the radio frequency range described later.

In the multilayer coil component according to the present disclosure, the first connecting conductor and the second connecting conductor each have a length not less than about 2.5% and not more than about 7.5% (i.e., from about 2.5% to about 7.5%) of the length of the multilayer body. Such a multilayer coil component has enhanced radio frequency characteristics in the radio frequency range (particularly from about 30 GHz or above to about 80 GHz or below— i.e., from about 30 GHZ to about 80 GHz). Specifically, the transmission coefficient S21 at 40 GHz of the multilayer coil component can be made not less than about −1 dB and not more than about 0 dB (i.e., from about −1 dB to about 0 dB), and the transmission coefficient S21 at 50 GHz of the multilayer coil component can be made not less than about −2 dB and not more than about 0 dB (i.e., from about −2 dB to about 0 dB).

The multilayer coil component can be thus suitably used for, for example, a bias-tee circuit within an optical communication circuit.

For the multilayer coil component according to the present disclosure, its radio frequency characteristics are evaluated based on the transmission coefficient S21 at 40 GHz. The transmission coefficient S21 is calculated from the ratio of the power of a transmitted signal to the power of an input signal. Although the transmission coefficient S21 is basically a dimensionless quantity, the transmission coefficient S21 is normally represented in units of dB by taking its common logarithm.

In the multilayer coil component according to the present disclosure, there may be two or more first connecting conductors and two or more second connecting conductors.

A case where there are two or more first connecting conductors and two or more second connecting conductors is when a portion of each outer conductor that covers the corresponding end face, and a coil conductor facing the portion of the outer electrode are connected at two or more locations by such connecting conductors.

Figure 6A:
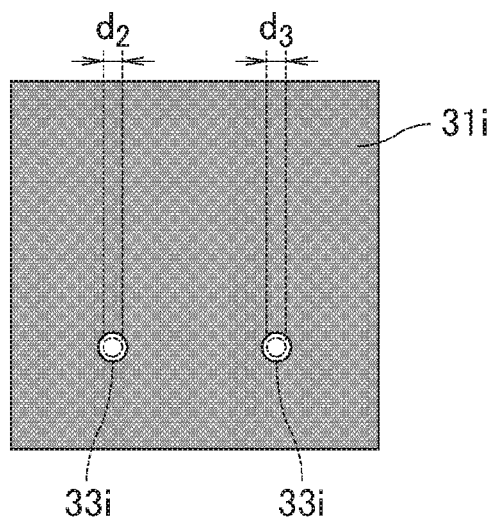
FIGS. 6A to 6C are plan views each schematically illustrating the shape of an adjustment pattern constituting another example of a multilayer coil component according to the present disclosure.
Figure 6B:
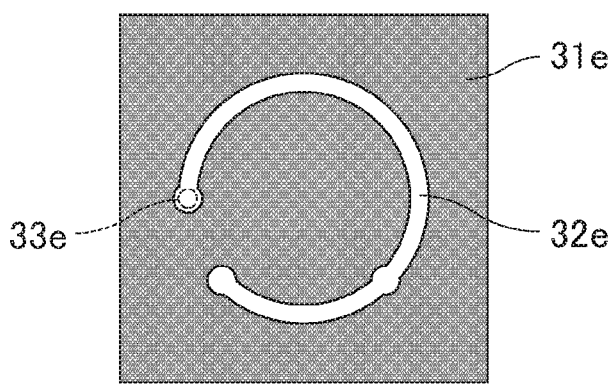
Figure 6C:
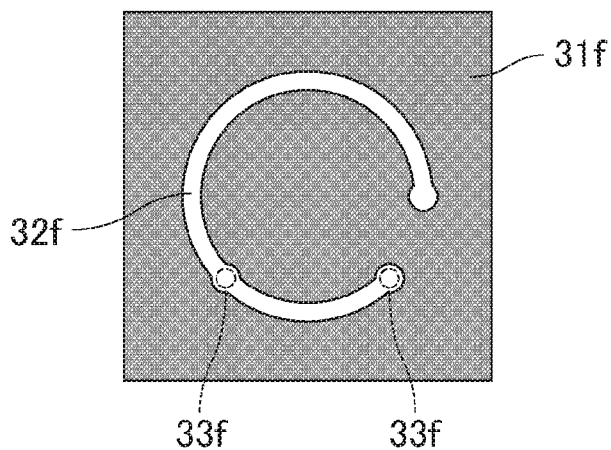

One method to obtain a multilayer coil component with two or more first connecting conductors and two or more second connecting conductors is to use adjustment patterns illustrated in FIGS. 6A to 6C. FIGS. 6A to 6C are plan views each schematically illustrating the shape of an adjustment pattern constituting another example of a multilayer coil component according to the present disclosure.

A multilayer coil component with two first connecting conductors and two second connecting conductors can be obtained by changing some of the insulating layers constituting the multilayer coil component 1 illustrated in FIGS. 3 to 5C to the adjustment patterns illustrated in FIGS. 6A to 6C. Specifically, each of the insulating layers 31g and 31h illustrated in FIGS. 3 and 4 is changed to an insulating layer 31i illustrated in FIG. 6A, and further, the insulating layer 31a adjacent to the insulating layer 31g and the insulating layer 31d adjacent to the insulating layer 31g are respectively changed to an insulating layer 31e and an insulating layer 31f to thereby obtain a multilayer coil component having two or more first connecting conductors and two or more second connecting conductors.

For the adjustment pattern illustrated in FIG. 6A, the insulating layer 31i is provided with two via conductors 33i. For the adjustment pattern illustrated in FIG. 6B, a coil conductor 32e is provided on the insulating layer 31e. When the insulating layer 31i is laid over the insulating layer 31e, the via conductors 33i overlap the coil conductor 32e. As the via conductors 33i overlap the coil conductor 32e, two first connecting conductors are formed. The insulating layer 31b is disposed below the insulating layer 31e, and a via conductor 33e overlaps the coil conductor 32b.

For the adjustment pattern illustrated in FIG. 6C, a coil conductor 32f and two via conductors 33f are provided on the insulating layer 31f. When the insulating layer 31f is laid over the insulating layer 31i, the via conductors 33i overlap the via conductors 33f. As the via conductors 33i overlap the via conductors 33f, two second connecting conductors are formed.

At this time, the first connecting conductor and the second connecting conductor each have a width equal to the sum of the widths ($d_2+d_3$) of the via conductors 33i formed in the insulating layer 31i.

An exemplary method for manufacturing a multilayer coil component according to the present disclosure will be described below.

First, ceramic green sheets that will become insulating layers are fabricated.

For example, an organic binder such as polyvinyl butyral-based resin, an organic solvent such as ethanol or toluene, and a dispersant are added to a ferrite raw material, followed by kneading to form a slurry. Then, by using a method such as doctor-blade, a magnetic material sheet with a thickness of about 12 μm is obtained.

As a ferrite raw material, for example, iron, nickel, zinc, and copper oxide raw materials are mixed together and calcined at about 800° C. for about one hour, and the resulting mixture is ground in a ball mill and dried, thus obtaining a Ni—Zn—Cu-based ferrite raw material (oxide powder mixture) with a mean grain diameter of about 2 μm.

As the material of a ceramic green sheet that will become each insulating layer, for example, a magnetic material such as ferrite, a non-magnetic material such as glass-ceramic, or a material mixture of such a magnetic material and a non-magnetic material can be used. In fabricating a ceramic green sheet by use of a ferrite material, it is preferable to use a ferrite material with the following composition from the viewpoint of obtaining a high L-value (inductance): $Fe_2O_3$: not less than about 40 mol % and not more than about 49.5 mol % (i.e., from about 40 mol % to about 49.5 mol %), ZnO: not less than about 5 mol % and not more than about 35 mol % (i.e., from about 5 mol % to about 35 mol %), CuO: not less than about 4 mol % and not more than about 12 mol % (i.e., from about 4 mol % to about 12 mol %), the remainder: NiO and trace amounts of additives (including incidental impurities).

Ceramic green sheets fabricated as described above are each subjected to a predetermined laser beam machining process to form a via hole with a diameter of not less than about 20 μm and not more than about 30 μm (i.e., from about 20 μm to about 30 μm). An Ag paste is applied onto specific sheets having a via hole to thereby fill the via hole. Further, a conductor pattern for forming a coil winding (coil conductor), which has a substantially ¾ turn shape with a thickness of about 11 μm, is screen-printed, followed by drying to obtain a coil sheet.

Coil sheets are stacked together such that a coil with a winding axis parallel to the mounting surface is formed inside the multilayer body after separation into each individual piece. Further, via sheets provided with via conductors that will become connecting conductors are stacked above and below the stack of coil sheets. At this time, the number of coil sheets and via sheets to be stacked, and the thicknesses of these sheets are adjusted so that the connecting conductors each have a length not less than about 2.5% and not more than about 7.5% (i.e., from about 2.5% to about 7.5%) of the length of the multilayer body. As required, at least one such via sheet may be formed as a marked via sheet provided with a marking conductor pattern.

The multilayer body is subjected to pressure bonding under heat to obtain a pressure-bonded body, which is then cut into discrete chips with predetermined dimensions to obtain individual chips. The corner and edges portions of each individual chip thus obtained may be rounded into a predetermined shape by using a rotating barrel.

By performing de-binding and firing at a predetermined temperature for a predetermined time, a fired body (multilayer body) with a coil built therein is obtained.

Each chip is immersed obliquely in a layer of Ag paste drawn into a predetermined thickness, following by baking to form an underlying electrode for the outer electrode on four faces (the major face, the end face, and both lateral faces) of the multilayer body.

As opposed to a method of forming an underlying electrode on each of the major face and the end face of the multilayer body in two separate steps, the above-mentioned method makes it possible to form the underlying electrode at once in a single step.

A Ni film and a Sn film are sequentially formed with a predetermined thickness on the underlying electrode by plating, thus forming the outer electrode.

Through the above-mentioned process, the multilayer coil component according to the present disclosure can be fabricated.

EXAMPLES

The following describes Examples representing more specific implementations of the multilayer coil component according to the present disclosure. It is to be understood that the present disclosure is not limited only to Examples described below.

Fabrication of Samples

Example 1

(1) A ferrite raw material (calcined powder) having a predetermined composition was prepared.

(2) The calcined powder, an organic binder (polyvinyl butyral-based resin), and an organic solvent (ethanol and toluene) were charged into a pot mill together with PSZ balls, and sufficiently mixed and ground in a wet method to produce a magnetic material slurry.

(3) The magnetic material slurry was formed into a substantially sheet-like shape by the doctor-blade method, which was then punched in a rectangular shape to produce a plurality of magnetic material sheets with a thickness of about 15 μm.

(4) A conductive paste containing Ag powder and organic vehicle and used for forming an inner electrode was prepared.

(5) Fabrication of Via Sheets

A predetermined part of the magnetic material sheet was irradiated with a laser beam to form a via hole. A conductive paste was applied to fill the via hole, followed by screen printing with a conductive paste applied in a substantially circular shape around the filled via hole to thereby form a via conductor.

(6) Fabrication of Marked Via Sheets

A via conductor was formed in the same manner as described in (5) above, and further, a marking conductor pattern serving as a discrimination mark was printed.

(7) Fabrication of Coil Sheets

After a via hole was formed, and a conductive paste was applied to fill the via hole to form a via conductor, a coil conductor was printed.

(8) A predetermined number of sheets fabricated as described above were stacked in the order as illustrated in FIG. 3, and then applied with heat and pressure, followed by cutting with a dicer into each individual piece to obtain a green laminate.

(9) The green laminate was put into a kiln, or furnace, and subjected to de-binding at about 500° C. under the atmospheric environment, followed by firing at about 900° C. to produce a (fired) multilayer body. The respective dimensions of 30 multilayer bodies thus obtained were measured with a micrometer, and their mean values were calculated. The mean values were obtained as follows: L=0.60 mm, W=0.30 mm, T=0.30 mm.

(10) A conductive paste containing Ag powder and glass frit and used for forming an outer electrode was poured into a film-forming vessel so as to form a film with a predetermined thickness. The portion of the multilayer body where an outer electrode is to be formed was immersed in this film.

(11) After the immersion, baking was performed at about 800° C. to form an underlying electrode for the outer electrode.

(12) A Ni film and a Sn film were sequentially formed on the underlying electrode by electrolytic plating, thus forming the outer electrode.

Through the above process, samples according to Example 1 with a multilayer body having an internal structure as illustrated in FIG. 5A were fabricated.

The outer electrodes of the samples thus fabricated had a mean height (E2) of 0.15 mm.

Example 2

Samples according to Example 2 were fabricated by changing the number of stacked coil sheets that form coil conductors, and the number of stacked via sheets that form connecting conductors, and by changing the thickness of the magnetic material sheet constituting each coil sheet and each via sheet. The dimensions of the multilayer body, and the shape of each outer electrode were identical to those in Example 1.

Comparative Example 1

Samples according to Comparative Example 1 were fabricated by changing the number of stacked coil sheets that form coil conductors, and the number of stacked via sheets that form connecting conductors, and by changing the thickness of the magnetic material sheet constituting each coil sheet and each via sheet. The dimensions of the multilayer body, and the shape of each outer electrode were identical to those in Example 1.

For each of the samples according to Examples 1 and 2 and Comparative Example 1, the number of coil turns was set to 42.

Measurement of Connecting-Conductor Length

For each of the above-mentioned samples, the surroundings of the sample were hardened with resin such that an L-T face defined by the length L and the height T was exposed on the surface. Then, the L-T face was polished with a polisher to substantially the central portion of the multilayer body, followed by ion milling to remove sag due to polishing. An image of this polished surface was captured with a scanning electron microscope (SEM), the length of the coil and the length of each connecting conductor were measured, and the length of the connecting conductor relative to the length of the multilayer body was determined. For each of Examples 1 and 2 and Comparative Example 1, measurements were taken for 10 samples, and the proportion of the length of the connecting conductor to the length of the multilayer body was calculated from the mean value of these measurements.

The calculated length of the connecting conductor was 45 µm for Example 1, 40 µm for Example 2, and 65 µm for Comparative Example 1. The calculated length of the connecting conductor relative to the length of the multilayer body was 7.5% for Example 1, 6.7% for Example 2, and 10.8% for Comparative Example 1.

Measurement of Transmission Coefficient S21

Figure 7:
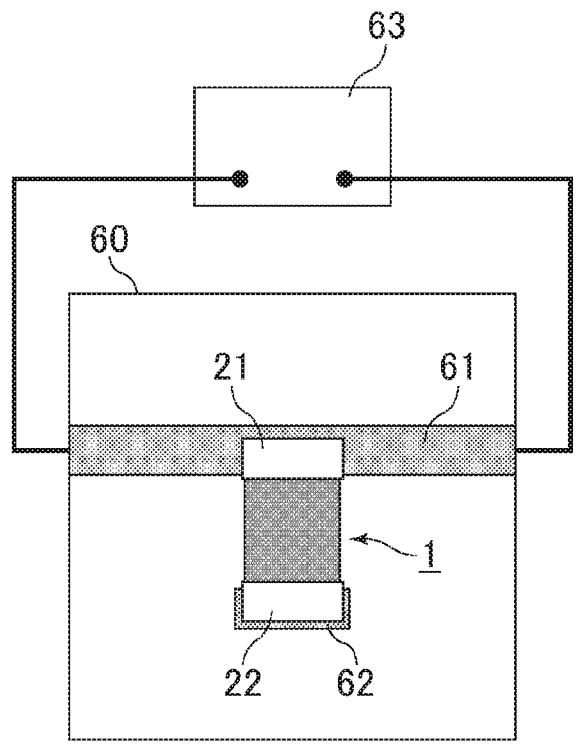
FIG. 7 schematically illustrates a method for measuring a transmission coefficient S21.

FIG. 7 schematically illustrates a method for measuring the transmission coefficient S21.

As illustrated in FIG. 7, a measurement jig 60 provided with a signal path 61 and a ground conductor 62 was soldered to a sample (multilayer coil component 1). The first outer electrode 21 of the multilayer coil component 1 is connected to the signal path 61, and the second outer electrode 22 is connected to the ground conductor 62.

By using a network analyzer 63, the power of a signal input to the sample and the power of a signal transmitted through the sample were determined, and the transmission coefficient S21 was measured with varying frequency. One end and the other end of the signal path 61 are connected to the network analyzer 63.

Figure 8:
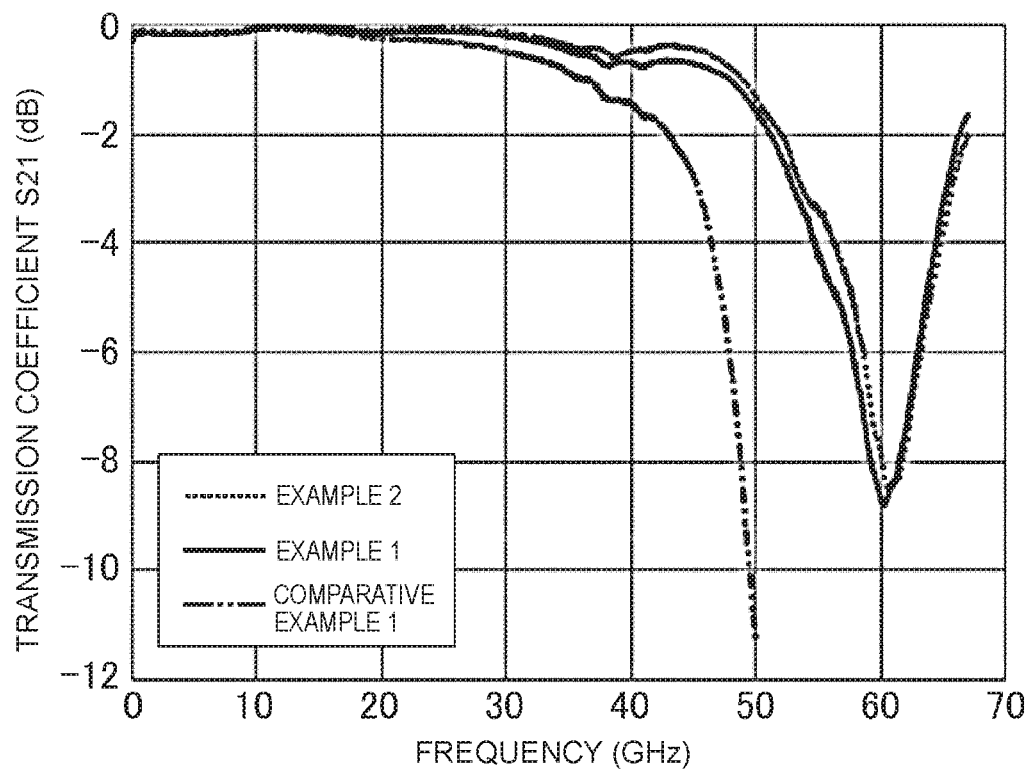
FIG. 8 is a graph illustrating transmission coefficients S21 according to Examples 1 and 2 and Comparative Example 1.

FIG. 8 is a graph illustrating transmission coefficients S21 according to Examples 1 and 2 and Comparative Example 1. In FIG. 8, the horizontal axis represents frequency (GHz), and the vertical axis represents transmission coefficient S21 (dB).

For the transmission coefficient S21, a value closer to 0 dB indicates less loss. It is appreciated from FIG. 8 that, for each of Example 1 and 2 in which the distance from the coil to each outer electrode (i.e., the length of each connecting conductor) is not more than about 7.5% of the length of the multilayer body, the transmission coefficient S21 at 40 GHz can be made not less than about −1 dB, and the transmission coefficient S21 at 50 GHz can be made not less than about −2 dB.

Examples 3 and 4

Simulation 1 of Transmission Coefficient S21: Connecting-Conductor Length

For each multilayer coil component fabricated under the conditions given below, the relationship between frequency and transmission coefficient S21 was simulated.

The results are illustrated in Table 1 and FIG. 9 as follows:
Width of the multilayer body: 300 µm
Length of the coil: 510 µm
Number of coil conductor turns: 42
Inner diameter of each coil conductor: 100 µm
Line width of each coil conductor: 60 µm
Film thickness of each coil conductor: 4 µm
Distance between the coil conductors (thickness of each insulating layer): 5 µm
Length of each connecting conductor: 20 or 45 µm
Width of each connecting conductor: 30 µm
Width of the land constituting each connecting conductor: 80 µm

TABLE 1

|  | Example 3 | Example 4 |
|---|---|---|
| Length [%] of each of first and second connecting conductors relative to length of multilayer body | 7.5% | 3.6% |
| Transmission coefficient S21 [dB] at 40 GHz | −0.33 | −0.29 |
| Transmission coefficient S21 [dB] at 50 GHz | −1.51 | −1.12 |
| Resonant frequency [GHz] | 58.7 | 61.1 |

Examples 3, 5, and 6

Simulation 2 of Transmission Coefficient S21: Connecting-Conductor Width

The relationship between frequency and transmission coefficient S21 was simulated under the above-mentioned conditions with the length of each connecting conductor fixed to 45 µm and the width of the connecting conductor changed to be in the range of 30 to 50 µm. The results are illustrated in Table 2 and FIG. 10.

TABLE 2

|  | Example 3 | Example 5 | Example 6 |
|---|---|---|---|
| Widths [%] of each of first and second connecting conductors relative to width of multilayer body | 10.0% | 13.3% | 16.7% |
| Transmission coefficient S21 [dB] at 40 GHz | −0.33 | −0.29 | −0.26 |
| Transmission coefficient S21 [dB] at 50 GHz | −1.51 | −1.09 | −0.84 |
| Resonant frequency [GHz] | 58.7 | 61.4 | 64.1 |

Figure 9:
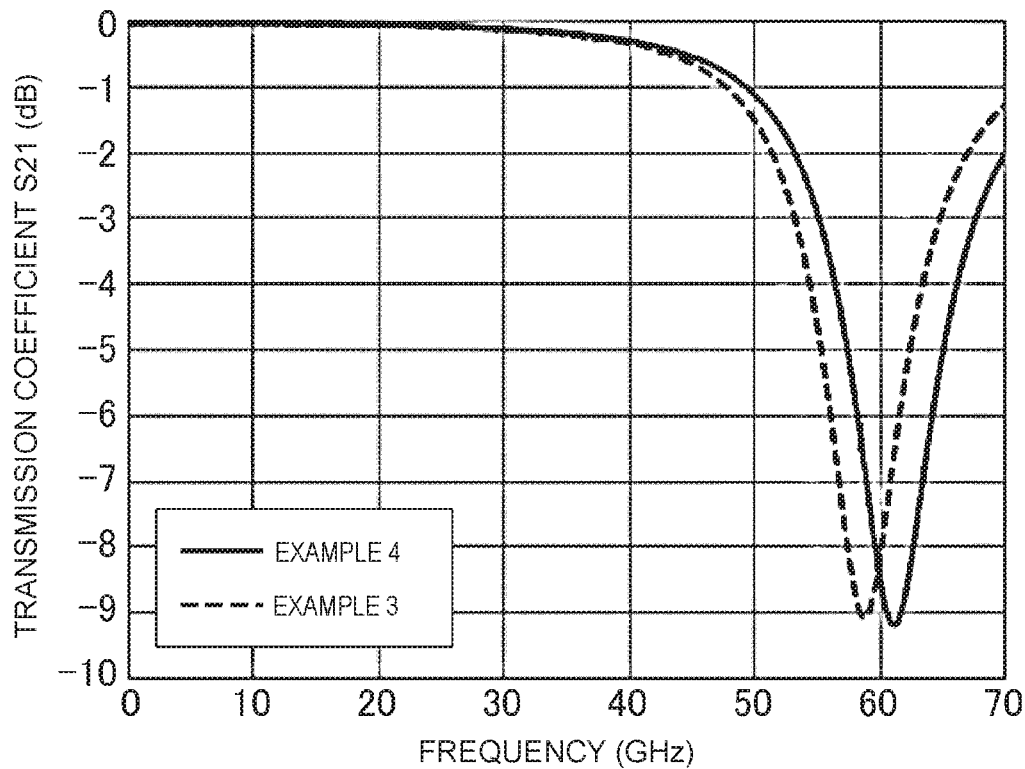
FIG. 9 illustrates simulated transmission coefficients S21.

It was confirmed from the results in FIGS. 8 and 9 and Table 1 that, for each of the samples according to Examples 1 to 4 in which the length of each connecting conductor is not less than about 2.5% and not more than about 7.5% (i.e., from about 2.5% to about 7.5%), the transmission coefficient S21 at 40 GHz is greater than about −1.0 dB, which indicates enhanced radio frequency characteristics. It was also confirmed from the results in FIG. 9 and Table 1 that reducing the length of each connecting conductor causes the resonant frequency to shift higher and causes the transmission coefficients S21 at 40 GHz and 50 GHz to become closer to 0 dB.

Figure 10:
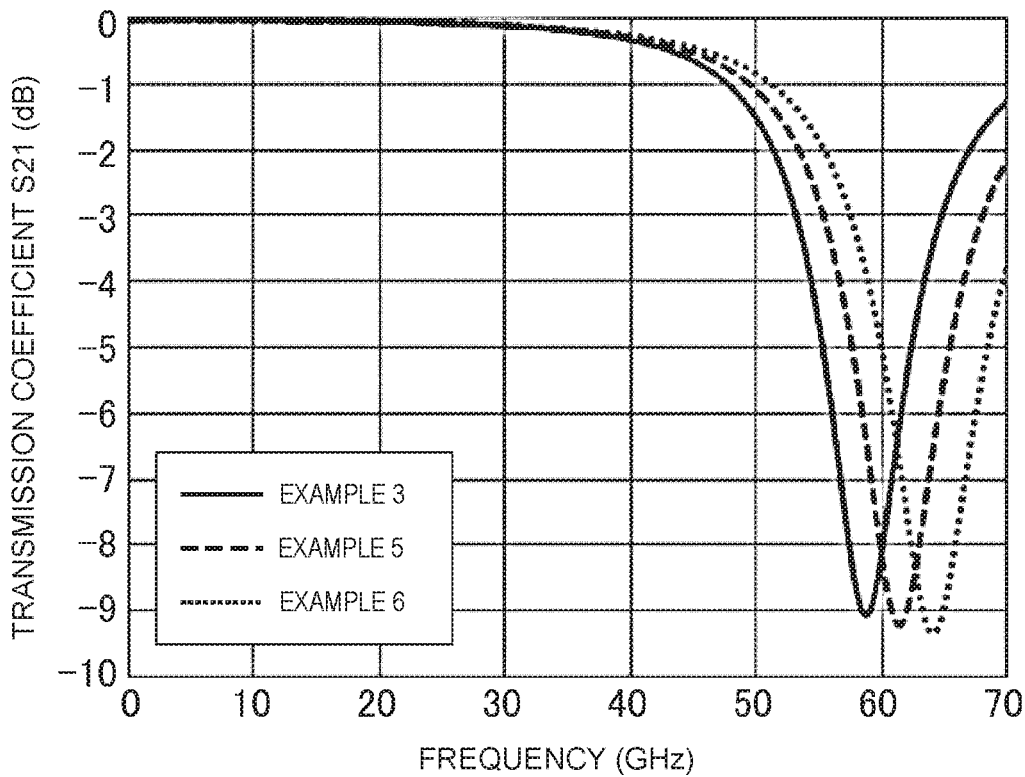
FIG. 10 illustrates simulated transmission coefficients S21.

It was confirmed from the results in FIG. 10 and Table 2 that increasing the width of each connecting conductor also causes the resonant frequency to shift higher, and causes the transmission coefficients S21 at 40 GHz and 50 GHz to become closer to 0 dB.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A multilayer coil component comprising:
a multilayer body formed by stacking a plurality of insulating layers, the multilayer body including a coil built in the multilayer body; and
a first outer electrode and a second outer electrode that are electrically connected to the coil,
wherein
the coil is formed by electrically connecting a plurality of coil conductors, the plurality of coil conductors being stacked together with the plurality of insulating layers,
the multilayer body has a first end face and a second end face that are located opposite to each other in a length direction of the multilayer body, a first major face and a second major face that are located opposite to each other in a height direction orthogonal to the length direction, and a first lateral face and a second lateral face that are located opposite to each other in a width direction orthogonal to the length direction and to the height direction,
the first outer electrode covers a part of the first end face, and extends from the first end face so as to cover a part of the first major face,
the second outer electrode covers a part of the second end face, and extends from the second end face so as to cover a part of the first major face,
the first major face is a mounting surface of the multilayer coil component,
a stacking direction of the multilayer body, and an axial direction of the coil are parallel to the mounting surface,
the multilayer coil component further includes a first connecting conductor and a second connecting conductor that are disposed inside the multilayer body,
the first connecting conductor connects between a portion of the first outer electrode that covers the first end face, and one of the plurality of coil conductors that faces the portion of the first outer electrode,
the second connecting conductor connects between a portion of the second outer electrode that covers the second end face, and one of the plurality of coil conductors that faces the portion of the second outer electrode, and
the first connecting conductor and the second connecting conductor each have a length from about 2.5% to about 7.5% of a length of the multilayer body.

2. The multilayer coil component according to claim 1, wherein
the multilayer body has a length of not more than about 0.63 mm,
the multilayer body has a width of not more than about 0.33 mm, and
the first connecting conductor and the second connecting conductor each have a width from about 8% to about 20% of the width of the multilayer body.

3. The multilayer coil component according to claim 1, wherein
the portion of the first outer electrode that covers the first end face, and the one coil conductor that faces the portion of the first outer electrode are connected to each other at two or more locations by the first connecting conductor, and
the portion of the second outer electrode that covers the second end face, and the one coil conductor that faces the portion of the second outer electrode are connected to each other at two or more locations by the second connecting conductor.

4. The multilayer coil component according to claim 1, wherein
as viewed in plan view in the stacking direction, the plurality of coil conductors overlap each other,
the portion of the first outer electrode that covers the first end face has a height of from about 0.10 mm to about 0.20 mm, and
the portion of the second outer electrode that covers the second end face has a height of from about 0.10 mm to about 0.20 mm.

5. The multilayer coil component according to claim 1, wherein
the multilayer coil component has a length of not more than about 0.63 mm, and
the multilayer coil component has a width of not more than about 0.33 mm.

6. The multilayer coil component according to claim 2, wherein
the portion of the first outer electrode that covers the first end face, and the one coil conductor that faces the portion of the first outer electrode are connected to each other at two or more locations by the first connecting conductor, and
the portion of the second outer electrode that covers the second end face, and the one coil conductor that faces the portion of the second outer electrode are connected to each other at two or more locations by the second connecting conductor.

7. The multilayer coil component according to claim 2, wherein
as viewed in plan view in the stacking direction, the plurality of coil conductors overlap each other,
the portion of the first outer electrode that covers the first end face has a height of from about 0.10 mm to about 0.20 mm, and
the portion of the second outer electrode that covers the second end face has a height of from about 0.10 mm to about 0.20 mm.

8. The multilayer coil component according to claim 3, wherein
as viewed in plan view in the stacking direction, the plurality of coil conductors overlap each other,
the portion of the first outer electrode that covers the first end face has a height of from about 0.10 mm to about 0.20 mm, and
the portion of the second outer electrode that covers the second end face has a height of from about 0.10 mm to about 0.20 mm.

9. The multilayer coil component according to claim 6, wherein
as viewed in plan view in the stacking direction, the plurality of coil conductors overlap each other,
the portion of the first outer electrode that covers the first end face has a height of from about 0.10 mm to about 0.20 mm, and
the portion of the second outer electrode that covers the second end face has a height of from about 0.10 mm to about 0.20 mm.

10. The multilayer coil component according to claim 2, wherein
the multilayer coil component has a length of not more than about 0.63 mm, and
the multilayer coil component has a width of not more than about 0.33 mm.

11. The multilayer coil component according to claim 3, wherein the multilayer coil component has a length of not more than about 0.63 mm, and the multilayer coil component has a width of not more than about 0.33 mm.

12. The multilayer coil component according to claim 4, wherein the multilayer coil component has a length of not more than about 0.63 mm, and the multilayer coil component has a width of not more than about 0.33 mm.

13. The multilayer coil component according to claim 6, wherein the multilayer coil component has a length of not more than about 0.63 mm, and the multilayer coil component has a width of not more than about 0.33 mm.

14. The multilayer coil component according to claim 7, wherein the multilayer coil component has a length of not more than about 0.63 mm, and the multilayer coil component has a width of not more than about 0.33 mm.

15. The multilayer coil component according to claim 8, wherein the multilayer coil component has a length of not more than about 0.63 mm, and the multilayer coil component has a width of not more than about 0.33 mm.

16. The multilayer coil component according to claim 9, wherein the multilayer coil component has a length of not more than about 0.63 mm, and the multilayer coil component has a width of not more than about 0.33 mm.

* * * * *